(12) United States Patent
Mullin et al.

(10) Patent No.: US 8,920,566 B2
(45) Date of Patent: Dec. 30, 2014

(54) WIRE FEED PRESSURE LOCK SYSTEM

(75) Inventors: Richard S. Mullin, Cromwell, CT (US); Igor V. Belousov, Kyiv (UA); Oleg G. Pankov, Kiev (UA); Igor V. Gulyayev, Kiev (UA)

(73) Assignee: United Technologies Corporation, Hartford, CT (US)

( * ) Notice: Subject to any disclaimer, the term of this patent is extended or adjusted under 35 U.S.C. 154(b) by 1036 days.

(21) Appl. No.: 12/981,667

(22) Filed: Dec. 30, 2010

(65) Prior Publication Data

US 2012/0171382 A1    Jul. 5, 2012

(51) Int. Cl.

| | |
|---|---|
| C23C 16/00 | (2006.01) |
| B65H 20/00 | (2006.01) |
| B21F 1/02 | (2006.01) |
| B21F 11/00 | (2006.01) |
| B21F 99/00 | (2009.01) |
| B21F 7/00 | (2006.01) |
| B65H 57/12 | (2006.01) |
| B65H 57/26 | (2006.01) |
| C23C 14/24 | (2006.01) |

(52) U.S. Cl.
CPC . *B65H 57/12* (2013.01); *B21F 1/02* (2013.01); *B65H 57/26* (2013.01); *B65H 2701/36* (2013.01); *C23C 14/246* (2013.01)
USPC ........... 118/726; 118/727; 226/181; 226/186; 226/187; 140/139; 140/140; 140/147; 140/149

(58) Field of Classification Search
CPC ........ C23C 14/246; B65H 57/14; B05D 7/20; B21F 21/00; B21F 1/023; B21F 23/002; B21F 23/005; B21F 23/007

USPC .................. 118/726, 727; 226/181, 186, 187; 140/139–149
See application file for complete search history.

(56) References Cited

U.S. PATENT DOCUMENTS

| | | |
|---|---|---|
| 3,024,965 A | 3/1962 | Milleron |
| 3,467,058 A | 9/1969 | Box et al. |

(Continued)

FOREIGN PATENT DOCUMENTS

| | | |
|---|---|---|
| DE | 19923654 A1 | 11/2000 |
| GB | 763541 | 12/1956 |

(Continued)

OTHER PUBLICATIONS

Siegfried Schiller et al., "Elektronenstrahltechnologie", Russian Translation p. 188, 1976, VEB Verlag Technik, Berlin, Germany.

(Continued)

*Primary Examiner* — Keath Chen
(74) *Attorney, Agent, or Firm* — Bachman & LaPointe, P.C.

(57) ABSTRACT

A pressure lock system passes a wire along a wire path from a wire source at a high pressure first region to a destination at a low pressure second region. The pressure lock system includes a pressure lock chamber. A first conduit has an interior positioned to pass the wire along the path and is mounted for rotation. A second conduit has an interior positioned to pass the wire from the pressure lock chamber and is also mounted for rotation. A motor may drive rotation of the first conduit and the second conduit. Pumps may maintain a pressure of the pressure lock chamber lower than a pressure of the first region.

17 Claims, 3 Drawing Sheets

(56) References Cited

U.S. PATENT DOCUMENTS

| | | | |
|---|---|---|---|
| 3,562,002 A * | 2/1971 | Smith | 427/566 |
| 3,860,444 A | 1/1975 | Donckel et al. | |
| 3,952,568 A | 4/1976 | Wareing et al. | |
| 4,049,172 A * | 9/1977 | Samokovliski et al. | 226/90 |
| 4,054,044 A | 10/1977 | Wareing et al. | |
| 4,098,445 A * | 7/1978 | Samokovliski et al. | 226/186 |
| 4,177,912 A * | 12/1979 | Samokovliski et al. | 226/176 |
| 5,321,792 A * | 6/1994 | Schonherr et al. | 392/388 |
| 5,427,295 A * | 6/1995 | David | 226/180 |
| 6,083,365 A | 7/2000 | Kitabatake et al. | |

FOREIGN PATENT DOCUMENTS

| | | |
|---|---|---|
| GB | 1180151 | 2/1970 |
| GB | 1201104 | 8/1970 |
| JP | 54160567 A | 12/1979 |
| JP | 60211071 A | 10/1985 |
| JP | 6033226 A | 2/1994 |
| WO | 2005/077586 A1 | 8/2005 |

OTHER PUBLICATIONS

European Search Report for EP Patent Application No. 11194780.0, dated Nov. 19, 2012.

* cited by examiner

WIRE FEED PRESSURE LOCK SYSTEM

BACKGROUND

The disclosure relates to wire feeding. More particularly, the disclosure relates to feeding of wire from one atmospheric condition to another.

Wire feeding systems are used in many industrial processes. Exemplary processes include: welding; coating; and electro-explosive powder formation. In various such systems, the wire is fed from a source (e.g., a spool) at one atmospheric condition to a destination at another atmospheric condition. Exemplary atmospheric conditions may differ in terms of pressure and/or composition. For example, the source may be at essentially ambient atmospheric conditions whereas the destination may be at a much lower pressure such as a vacuum or very low pressure noble gas or reactive gas.

SUMMARY

One aspect of the disclosure involves a pressure lock system for passing a wire along a wire path from a wire source at a high pressure first region to a destination at a low pressure second region. The pressure lock system includes a pressure lock chamber. A first conduit has an interior positioned to pass the wire along the path and is mounted for rotation. A second conduit has an interior positioned to pass the wire from the pressure lock chamber and is also mounted for rotation. There are means such as a motor for driving rotation of the first conduit and the second conduit as an integral unit. There are means such as pumps for maintaining a pressure of the pressure lock chamber lower than a pressure of the first region.

In various implementations, the first conduit may comprise a body and an inlet end piece harder than the body. The system may include a second pressure lock chamber and a third conduit having an interior positioned along the wire path to pass the wire downstream of the second conduit and also mounted for rotation.

The details of one or more embodiments are set forth in the accompanying drawings and the description below. Other features, objects, and advantages will be apparent from the description and drawings, and from the claims.

BRIEF DESCRIPTION OF THE DRAWINGS

Like reference numbers and designations in the various drawings indicate like elements.

DETAILED DESCRIPTION

Figure 1:
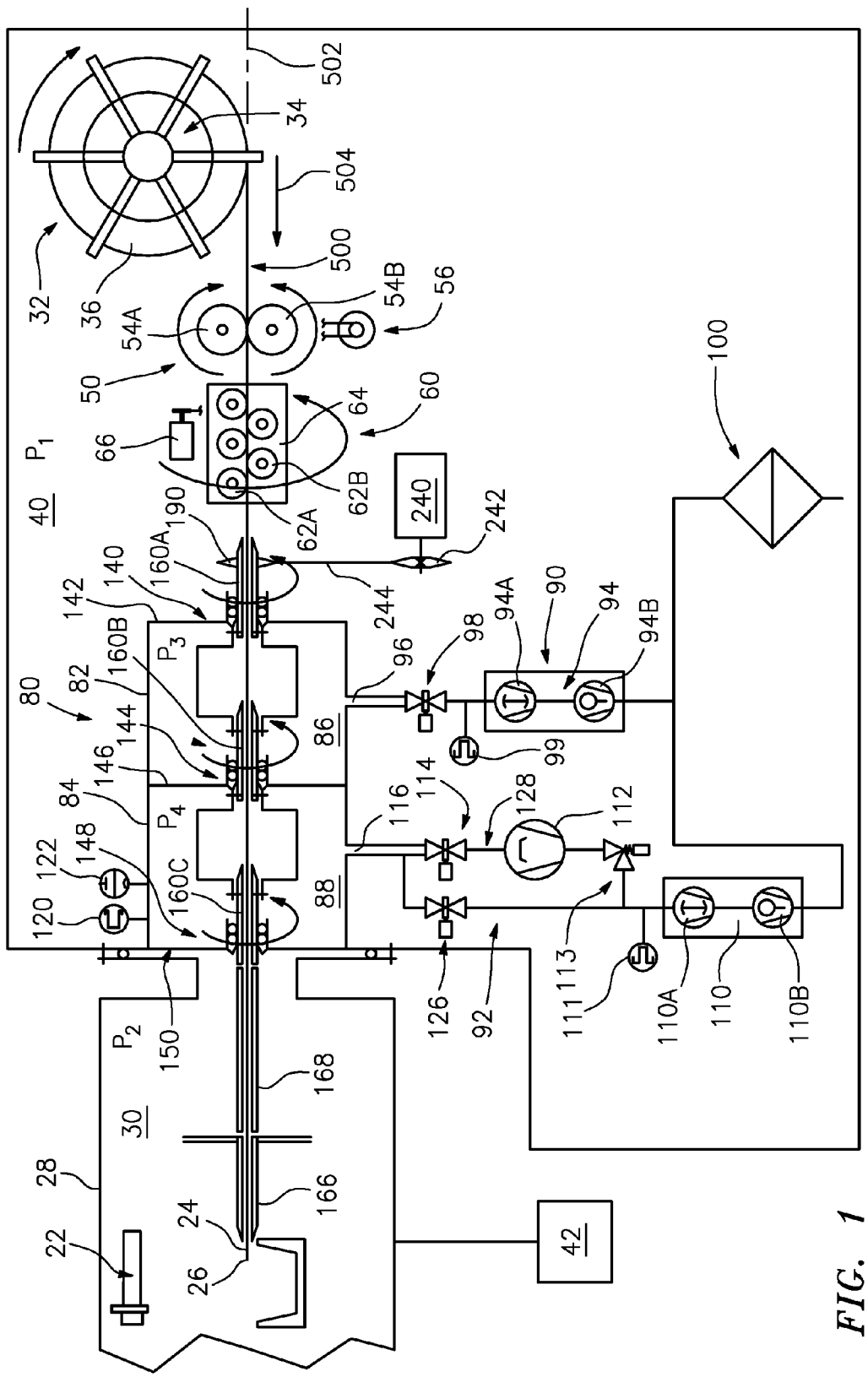
FIG. 1 is a partially schematic view of a coating system having a wire feed pressure lock system.

FIG. 1 shows a coating system 20 for applying coatings to substrates 22. The coatings are generated at least partially from a wire 24. Exemplary coatings are generated by vaporizing material from an end 26 of the wire in a coating chamber 28 having an interior 30. The wire passes along a wire path 500 from a source 32. The exemplary source comprises a spool 34 holding an accumulation 36 of the wire. The wire passes along the wire path 500 in a downstream direction 504 from the source to the interior coating chamber. The exemplary wire source is in an exterior region 40 at a relatively high pressure $P_1$ (e.g., ambient conditions). The exemplary chamber interior 30 forms a second region at a pressure $P_2$ lower than the first pressure $P_1$. A vacuum system 42 may evacuate and maintain the coating chamber interior at $P_2$. Depending upon circumstances, process gases may be introduced to the coating chamber from one or more gas sources (not shown).

Wire is driven from the spool along the wire path via a wire feed (drive) mechanism 50. An exemplary wire feed mechanism 50 comprises a pair of opposed feed wheels or rolls 54A, 54B sandwiching the wire therebetween and driven by a first motor 56. Downstream of the wire feed mechanism, the wire passes through a wire straightening mechanism 60. Downstream of the wire straightening mechanism, the wire and its path 500 proceed essentially along a line or axis 502. The exemplary straightening mechanism 60 comprises a first group of rollers 62A and a second group of rollers 62B engaging the wire on opposite sides of the wire and its flowpath and streamwise alternating with each other. The exemplary rollers are freely mounted on a carrier 64 for rotation about respective axes. The carrier is mounted for rotation about an axis 502 which is essentially locally coincident with the flowpath. The carrier 64 is coupled to a motor 66 to be driven by the motor around the axis 502 (e.g., an electric motor via chain, belt, or gear drive). As so far described, the source, feed mechanism, and straightening mechanism may represent an existing or yet-developed system.

In order to facilitate the pressure difference between $P_1$ and $P_2$ and/or prevent or substantially reduce infiltration of atmospheric contaminants to the coating chamber, the system 20 includes an isolation system (pressure lock system) 80. As is discussed further below, the exemplary isolation system includes two intermediate chambers 82 and 84 having respective interiors 86 and 88. As is discussed further, below, the interiors 86 and 88 may, in operation, be maintained at respective pressures $P_3$ and $P_4$ at least lower than the first pressure $P_1$. In a particular implementation, $P_2$ is lower than $P_4$, $P_3$ is lower than $P_1$, and $P_4$ is lower than $P_3$. An exemplary means for maintaining a pressure of one or more of the pressure lock chambers below the first pressure $P_1$ comprises at least one pump. In the exemplary implementation, this includes at least partially separate pumps for the chambers 82 and 84. In the exemplary system, a first pumping system 90 is associated with the chamber 82 and includes a mechanical pump 94. The pump 94 is coupled to a port 96 of the chamber 82 via a valve 98 (e.g., a butterfly valve such as the model VBA100IE of the Varian Vacuum Products unit of Agilent Technologies, Inc., Santa Clara, Calif.). The discharge of the pump 94 is coupled to an oil separator 100 (e.g., a mist separator) which may have an oil return to any associated pumps and may discharge to atmosphere. The exemplary second pumping system 92 has more pump stages than the first pumping system 90 to maintain the lower pressure $P_4$. The exemplary second stage is formed by a mechanical pump 110 (e.g., similar to the pump 94) whose discharge is coupled in parallel to the same separator 100 as that of the pump 94. Exemplary pumps 94 and 110 (e.g., Stokes Vacuum, Inc. (now Edwards Limited, Tewksbury, Mass.) multi-stage high capacity vacuum pump model 1736) each comprise two mechanical pumps in series (e.g., a blower 94A, 110A (e.g., Stokes Vacuum, Inc. blower model 612), and a piston pump 94B, 110B (e.g., Stokes Vacuum, Inc. Microvac™ rotary piston pump model 150)).

Each of the pumps 94 and 110 may further have an associated pressure gauge 99 and 111 (e.g., a Pirani gauge) along the line at the suction port thereof. The exemplary second system 92 further includes a second stage pump 112 (e.g., a diffusion pump such as the model VHS-6 of the Varian Vacuum Products unit of Agilent Technologies, Inc., Santa Clara, Calif.). The exemplary pump 112 is coupled to the pump 110 via a valve 113 (e.g., a SECUVAC™ model DN63 valve of Oerlikon Leybold Vacuum GmbH, Koln, Germany which functions as a safety valve by blocking access to the diffusion pump in the case of leakage). Similar to the valve 98, a valve 114 (e.g., similar to 98) is positioned between the pump 112 and the associated port 116 of the second chamber. The chamber 88 may be similar to the chamber 86. In the exemplary embodiment, the diameter of the inlet 116 may be greater than that of 96 due to a higher vacuum in the chamber 84 than in 86. For further pressure measurement, the second chamber has attached thereto a pressure gauge 120 which, similar to the gauges 99 and 111, may be a Pirani gauge. Additionally, the chamber 84 further includes a cold cathode gauge 122 for pressure measurements at low pressures.

The exemplary pump 110 is connected to the chamber 88 in two ways: directly via a first path/line 124 (having a valve 126 therein); and indirectly via a second path 128 through the diffusion pump 112. In operation, at first the valve 126 and first path are open while the valves 113 and 114 and second path are closed and the pump 110 evacuates the second chamber 84 through the valve 126 and first path. By having both valves 113 and 114 closed, the diffusion pump 112 is isolated for its protection. Then (when pressure in the chamber 84 drops below a threshold of about $10^{-3}$ Pa) the valves 113 and 114 open (connecting the diffusion pump 112 to the chamber 84 and to the pump 110), and the valve 126 closes, and the pump 110 begins to operate through the diffusion pump 112 operating in series.

In order to isolate each chamber 82, 84, 28 from the adjacent upstream and/or downstream conditions along the wire flowpath to allow the associated pumps to maintain desired pressures, the wires are passed at each of the three junctions/interfaces through closely accommodating narrow tube-like conduits. For example, there is a first interface 140 at an upstream wall 142 of the chamber 86; a second interface 144 at a wall 146 between the chambers 82 and 84; and a third interface 148 at a downstream wall 150 of the chamber 84 between the chamber 84 and the chamber 28. The exemplary conduits are labeled 160A, 160B, and 160C. As is discussed further below, in operation each of the conduits 160 may rotate. Exemplary rotation is about a common axis as an integral unit. After entering the chamber 28, the wire may pass through one or more rotating or non-rotating conduit 166 or 168 (e.g., cooling or mere guide conduits held to not rotate with the conduits 160).

Each of the exemplary conduits is mounted to its associated wall via a bearing and sealing system 170. Each exemplary bearing and sealing system 170 includes a main body 172 having a mounting flange 174 secured to the associated wall. The main body has a bearing compartment carrying a pair of bearing assemblies 176A and 176B (e.g., ball bearings) whose inner races engage a main body (e.g., metal such as a tool steel, HRC-50) 180 of the conduit (180A for the upstream conduit and 180B and 180C for the next two conduits). The exemplary body 172 also has a seal compartment carrying a lip seal 182 downstream of the bearings. The exemplary body further has a cover 184 covering the compartment (184A for the upstream conduit and 184B and 184C for the next two).

The exemplary upstream conduit body 180A carries a drive gear 190 and the cover 184A carries a seal 192 engaged with the drive gear. The exemplary drive gear is secured against rotation via a key 194 and axially retained via a nut 196 on a threaded portion of the conduit main body. Exemplary conduit body material is stainless steel with polished inner diameter aperture for reduced friction. At an upstream end of each conduit, the main body carries a hard anti-wear insert 200 (e.g., of metal ceramics such as BK6 (former Soviet designation for powder composite: 94W2C+6Co (wt. %), HRA>=87.5) or former Soviet TK15). The bodies of the second and third conduits directly carry this insert in an upstream compartment (e.g., via threaded engagement). The first conduit carries this insert via a similar engagement to a collar 210 which is, at its downstream end, threaded to the same externally threaded upstream end of the main body as is the nut 196. A gasket 212 (e.g., vacuum rubber or polymer such as PolyPak™ of Parker Hannifin Corp, Cleveland, Ohio) may seal the collar and insert relative to the main body 180A.

Figure 2:
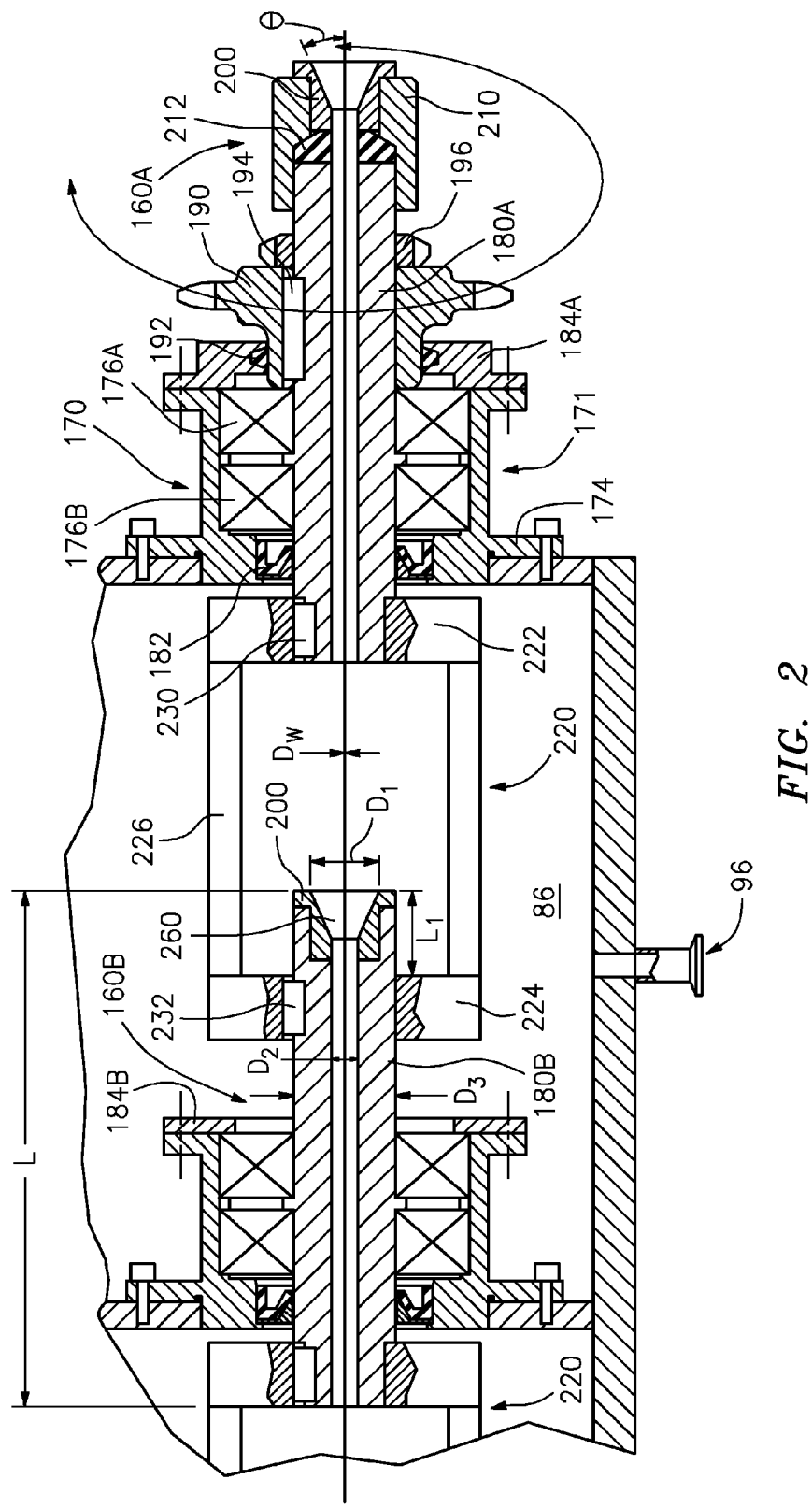
FIG. 2 is a partial enlarged view of an upstream portion of the pressure lock system of FIG. 1.
Figure 3:
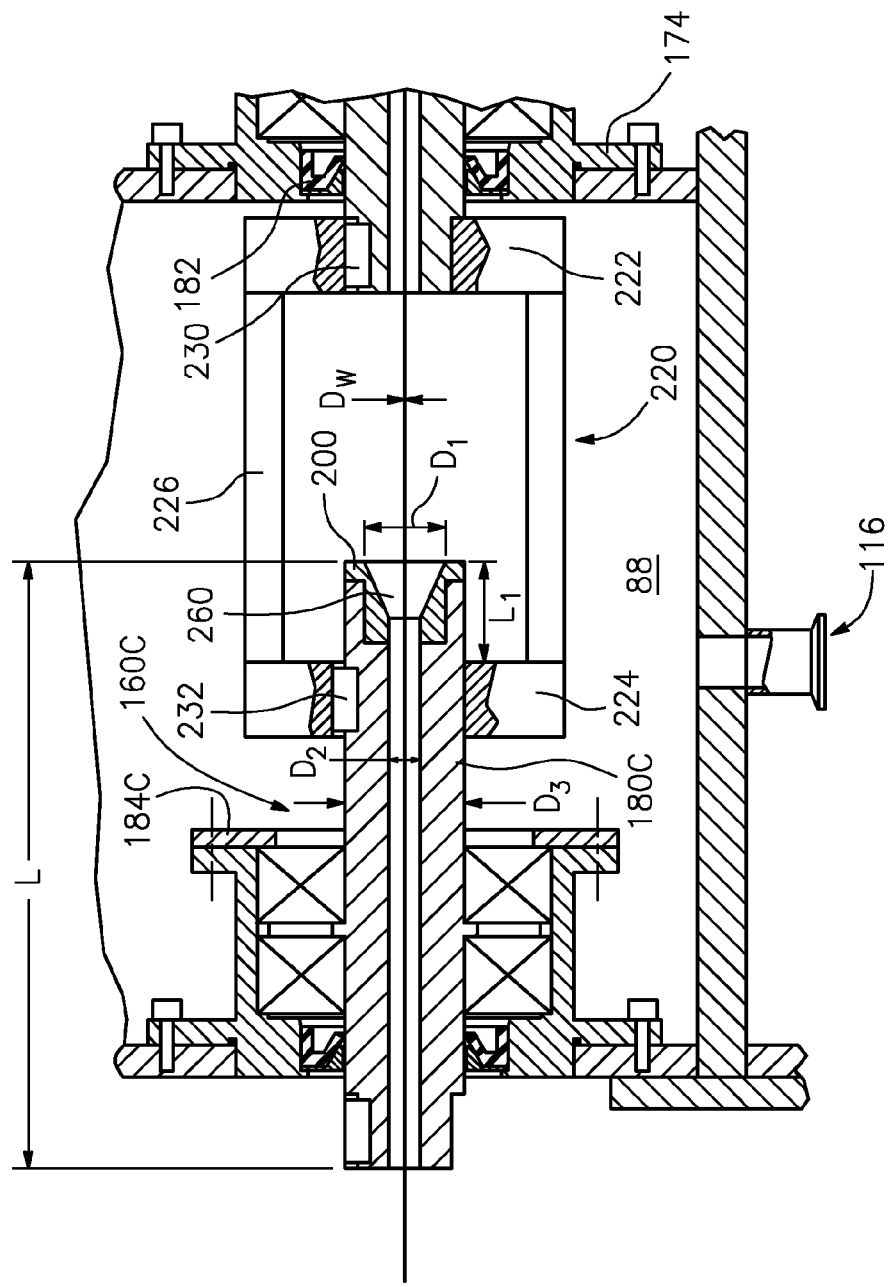
FIG. 3 is a partial enlarged view of a downstream portion of the pressure lock system of FIG. 1.

At their downstream ends, the bodies 180A and 180B may bear features for engaging the next respective conduit downstream. Similarly, at upstream ends, the conduit bodies 180B and 180C may bear features for engaging the next upstream conduit. This engagement is via a respective pair of cage structures 220 each having an upstream web or flange 222 and a downstream web or flange 224. The flanges 222, 224 are connected via links 226 (e.g., intact portions of a single cylindrical sleeve having venting apertures). Such a structure 220 allows communication between the interiors of the adjacent conduits and the interior 86 or 88 of the chamber 82 or 84 surrounding such structure 220. The exemplary engagement features at upstream and downstream ends of the structure 220 comprise keys 230, 232 securing the structure to the adjacent conduit bodies against rotation about the axis 502. Thus, rotation of the first conduit body 180A via the sprocket 190 drives all three of the conduits about the axis 502 as a unit. The rotation of the conduits serves to reduce friction between wire and the conduits. An exemplary rotational speed is 1-60 rpm, more narrowly 10-20 rpm. The exemplary conduit upstream end portions protrude into the adjacent chamber or other space. FIG. 2 shows a protrusion length $L_1$ for the second conduit upstream of the upstream face of the flange 224. Relative to a flush situation, this protrusion may help discourage leakage. Exemplary $L_1$ is larger than $D_2$ (e.g., at least twice as large as $D_2$ and at least about as large as $D_1$).

As noted above, exemplary means for driving rotation of the conduits drives the conduits as a unit. An exemplary such means comprises a rotary actuator 240 coupled to the conduits via a transmission. An exemplary rotary actuator is an electric motor. An exemplary transmission comprises a belt or chain drive (e.g., having a drive pulley or gear 242 on the motor shaft and a driven pulley or gear (e.g., 190) secured relative to the conduits and driven via a belt or chain 244).

An exemplary overall length for each conduit is shown as L (which may differ conduit-to-conduit). An exemplary inner diameter of the conduit is shown as $D_2$. In the exemplary embodiment, $D_2$ is constant or essentially constant (e.g., offering no difference in airflow performance) over a majority of the associated length L. For example, the exemplary embodiment $D_2$ is constant along a region where the conduit body is directly exposed to the wire and diverges upstream along a portion of the insert. In the exemplary implementation, the insert has a frustoconical segment surface 260 having a downstream portion at $D_2$ and transitioning to an upstream/opening having a diameter of $D_1$. An exemplary half angle of this portion is shown as θ. An exemplary diameter (or other largest transverse dimension for a non-circular cross-section) of the wire is shown as $D_W$. Exemplary $D_W$ is 0.5-3 mm, more particularly 1-2 mm with a particular example of a steel or titanium wire of 1.4-1.6 mm. Exemplary $D_2$ is 1-6 mm, more particularly 1.5-3 mm or 2 mm in the example. Exemplary L is 50-250 mm, more particularly 100-200 mm or about 130 mm in the example. Whereas longer lengths may provide better pressure isolation, they increase manufacturing costs (e.g., of polishing the interior of the conduit). An exemplary ratio of $D_2$ to $D_W$ is 2:1.4 to 2:1.6, more broadly 2:1.3 to 2:1.8. The outer diameter $D_3$ of the conduit body may be selected for mechanical strength of the conduit in view of any desired $D_2$, L, and rotational speed and available bearings and seals.

One or more embodiments have been described. Nevertheless, it will be understood that various modifications may be made. For example, when implemented in the remanufacturing of an existing system or the reengineering of a configuration of such system, details of the existing system or configuration may influence details of any particular implementation. Accordingly, other embodiments are within the scope of the following claims.

What is claimed is:

1. A pressure lock system for passing a wire along a wire path from a wire source at a high pressure first region to a destination at a low pressure second region, the system comprising:
   a pressure lock chamber;
   a first conduit having an interior positioned to pass the wire along the wire path and mounted for rotation;
   a second conduit having an interior positioned to pass the wire from the pressure lock chamber downstream of the first conduit and mounted for rotation;
   means for driving rotation of the first conduit and the second conduit as an integral unit; and
   means for maintaining a pressure of the pressure lock chamber lower than a pressure of the first region.

2. The system of claim 1 wherein:
   the first conduit comprises a body and an inlet end piece harder than the body.

3. The system of claim 1 wherein:
   the means for driving rotation comprises a motor coupled to the conduits to drive said rotation; and
   the means for maintaining comprises at least one pump coupled to the pressure lock chamber.

4. The system of claim 1 further comprising:
   a second pressure lock chamber; and
   a third conduit having an interior positioned along the wire path to pass the wire downstream of the second conduit and mounted for rotation.

5. The system of claim 4 wherein:
   the second conduit is positioned to pass the wire from the pressure lock chamber to the second pressure lock chamber; and
   the first conduit, second conduit, and third conduit are mounted for coaxial rotation about a single axis.

6. The system of claim 5 wherein:
   the means for driving rotation is coupled to the first conduit, second conduit, and third conduit to drive their rotation as said integral unit about the single axis.

7. The system of claim 6 further comprising:
   a fourth conduit, downstream of the third conduit along the wire flowpath and held to not rotate with the first, second, and third conduits.

8. The system of claim 7 further comprising:
   a fifth conduit, downstream of the fourth conduit, and being a terminal conduit.

9. A wire delivery system comprising:
   the system of claim 4;
   said wire source supplying the wire; and
   a wire straightener between the source and the first conduit.

10. A vacuum coating system comprising:
    the system of claim 9 wherein the wire source is at the first region; and
    a coater comprising:
       a coating chamber having an interior defining the second region; and
       means for forming a coating from the wire delivered to the coating chamber.

11. The system of claim 10 wherein:
    the first region is at ambient conditions.

12. A method for operating the system of claim 11 comprising simultaneously:
    driving a rotation of the combined first conduit, second conduit, and third conduit;
    maintaining the pressure lock chamber at a third pressure below the first pressure;
    maintaining the second pressure lock chamber at a fourth pressure below the third pressure;
    maintaining the coating chamber at said second pressure, below the first pressure and below the fourth pressure;
    feeding the wire from the source to the straightener;
    straightening the wire by the straightener;
    passing the wire through the first conduit, second conduit, and third conduit into the coating chamber; and
    forming a coating from the wire.

13. The method of claim 12 wherein:
    the forming of the coating comprises vaporizing the wire; and
    the method further comprises passing the wire through a liquid-cooled fourth conduit downstream of the third conduit.

14. A wire delivery system for delivering wire along a wire flowpath to a destination, the system comprising:
    a wire feed mechanism;
    a pressure lock chamber;
    a first conduit having an interior positioned to pass the wire along the wire path and mounted for rotation;
    a second conduit having an interior positioned to pass the wire from the pressure lock chamber downstream of the first conduit and mounted for rotation;
    a rotary actuator coupled to the first conduit and the second conduit so as to drive the rotation of the first conduit and the second conduit as an integral unit; and
    a pump coupled to the pressure lock chamber for maintaining a pressure of the pressure lock chamber lower than a pressure of a first region.

15. The wire delivery system of claim 14 wherein:
    the wire feed mechanism is driven by a motor separate from the rotary actuator.

16. The wire delivery system of claim 14 wherein:
    the wire feed mechanism is upstream of the first conduit and second conduit.

17. A vacuum coating system comprising:
    the wire delivery system of claim 14; and
    a coater comprising:
       a coating chamber having an interior; and
       means for forming a coating from the wire delivered to the coating chamber.

* * * * *